(12) United States Patent
Ozeki et al.

(10) Patent No.: US 8,026,572 B2
(45) Date of Patent: Sep. 27, 2011

(54) SEMICONDUCTOR DEVICE AND METHOD FOR MANUFACTURING SAME

(75) Inventors: Yoshihiko Ozeki, Nukata-gun (JP);
Kenji Kouno, Gifu (JP); Tetsuo Fujii, Toyohashi (JP)

(73) Assignee: DENSO CORPORATION, Kariya (JP)

( * ) Notice: Subject to any disclaimer, the term of this patent is extended or adjusted under 35 U.S.C. 154(b) by 897 days.

(21) Appl. No.: 11/987,676

(22) Filed: Dec. 4, 2007

(65) Prior Publication Data

US 2008/0135932 A1 Jun. 12, 2008

(30) Foreign Application Priority Data

Dec. 6, 2006 (JP) .................................. 2006-329858
Oct. 11, 2007 (JP) .................................. 2007-265766

(51) Int. Cl.
| | |
|---|---|
| H01L 21/70 | (2006.01) |
| H01L 29/00 | (2006.01) |
| H01L 29/02 | (2006.01) |
| H01L 21/82 | (2006.01) |
| H01L 21/76 | (2006.01) |
| H01L 27/118 | (2006.01) |
| H01L 23/52 | (2006.01) |

(52) U.S. Cl. ........ 257/513; 257/205; 257/206; 257/207; 257/208; 257/516; 257/517; 438/128; 438/424; 438/430

(58) Field of Classification Search ........................ None
See application file for complete search history.

(56) References Cited

U.S. PATENT DOCUMENTS

| | | | | |
|---|---|---|---|---|
| 3,943,555 | A | * | 3/1976 | Mueller et al. ................. 257/506 |
| 6,124,179 | A | * | 9/2000 | Adamic, Jr. ..................... 438/309 |
| 6,297,090 | B1 | | 10/2001 | Kim |
| 6,309,929 | B1 | | 10/2001 | Hsu et al. |
| 6,365,932 | B1 | | 4/2002 | Kouno et al. |
| 6,369,426 | B2 | | 4/2002 | Blanchard et al. |
| 6,524,890 | B2 | | 2/2003 | Ueda et al. |
| 6,879,029 | B2 | | 4/2005 | Ueda et al. |
| 7,238,576 | B2 | | 7/2007 | Yamaguchi et al. |

FOREIGN PATENT DOCUMENTS

| | | |
|---|---|---|
| JP | A-8-153687 | 6/1996 |
| JP | A-2001-127149 | 5/2001 |
| JP | A-2006-173296 | 6/2006 |
| JP | A-2006-179632 | 7/2006 |

OTHER PUBLICATIONS

Office Action dated Dec. 4, 2009 issued in the corresponding Chinese patent application No. 2007101964663 (English translation enclosed).

Office Action issued on Jun. 6, 2011 in the corresponding German application No.: 10 2007 058 556.1 (English translation enclosed).

* cited by examiner

*Primary Examiner* — Hoang-Quan Ho
(74) *Attorney, Agent, or Firm* — Posz Law Group, PLC

(57) ABSTRACT

A semiconductor device having plural active and passive elements on one semiconductor substrate is manufactured in the following cost effective manner even when the active and passive elements include double sided electrode elements. When the semiconductor substrate is divided into plural field areas, an insulation separation trench that penetrates the semiconductor substrate surrounds each of the field areas, and each of the either of the plural active elements or the plural passive elements. Further, each of the plural elements has a pair of power electrodes for power supply respectively disposed on each of both sides of the semiconductor substrate to serve as the double sided electrode elements.

30 Claims, 15 Drawing Sheets

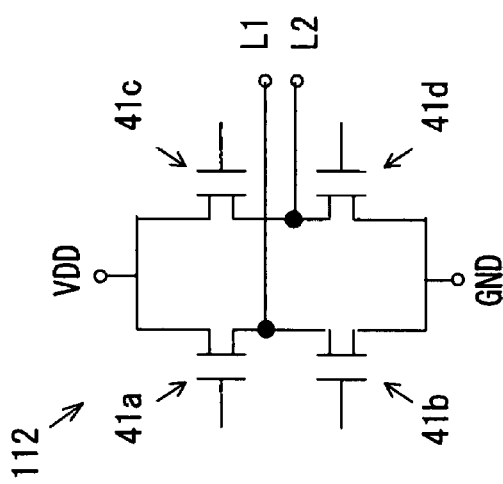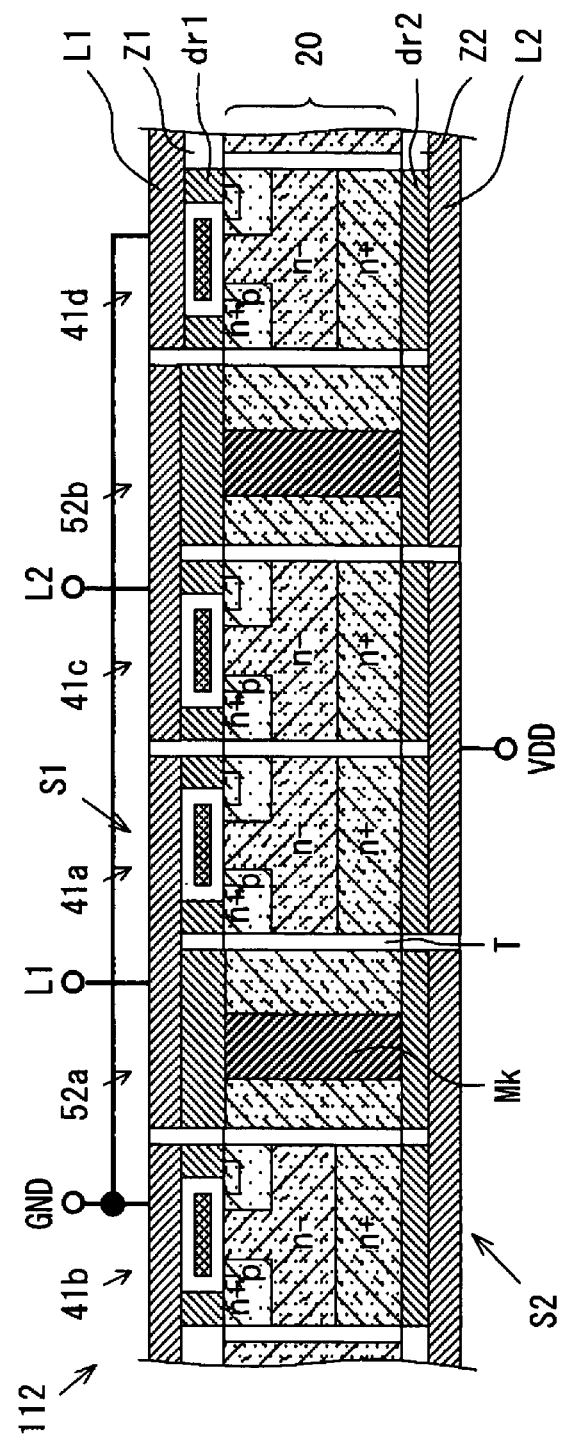
FIG. 8A
FIG. 8B

SEMICONDUCTOR DEVICE AND METHOD FOR MANUFACTURING SAME

CROSS REFERENCE TO RELATED APPLICATION

This application is based on and claims the benefit of priority of Japanese Patent Application No. 2006-329858 filed on Dec. 6, 2006, and No. 2007-265766 filed on Oct. 11, 2007, the disclosure of which is incorporated herein by reference.

FIELD OF THE DISCLOSURE

The present disclosure generally relates to a semiconductor device having plural elements on one substrate and method for manufacturing the device.

BACKGROUND INFORMATION

A semiconductor device having a metal oxide semiconductor (MOS) transistor and a bipolar transistor formed on one semiconductor substrate is disclosed, for example, in Japanese Patent Laid-Open No. 2001-60634 (Patent literature 1: U.S. Pat. No. 6,365,932 B1). FIG. 15 is a conventional semiconductor device disclosed in Patent literature 1 for illustrating a section of a semiconductor device 90.

The semiconductor device 90 shown in FIG. 15 is a composite IC that an active element and a passive element are formed on one semiconductor substrate 1. The semiconductor device 90 is a device for a controller of automotive vehicles, and drives load of a fuel injector (solenoid valve) or the like. The semiconductor device 90 has circuitry such as UpDrain MOSFET 8, NPN transistor 9, CMOS 10 and the like in an integrated manner.

The semiconductor device 90 in FIG. 15 uses Silicon On Insulator (SOI) board 1 as a semiconductor substrate. The SOI board 1 is manufactured by putting together substrates, and has a layered structure that a thin silicon layer 4 is disposed on top of a p-type silicon board 2 with a silicon oxide film 3 interposed therebetween. A trench 7 is formed on the silicon layer 4, and a silicon oxide film is formed on the inner wall surface of the trench 7, and a poly-silicon is filled up in the trench 7. A lot of island sections are formed by the trench 7, and nMOS and pMOS constituting the UpDrain MOSFET 8, the NPN transistor 9, the CMOS 10 are formed on each of the islands. Each of the UpDrain MOSFET 8, the NPN transistor 9 and CMOS 10 in the semiconductor device 90 is a single sided electrode element that has a pair of electrodes for driving those elements only on a silicon layer 4 side surface on the semiconductor substrate 1.

As the semiconductor device 90 shown in FIG. 15, the SOI board 1 having the silicon oxide film 3 buried by pasting two substrates is used for various kinds of uses such as the speedup of a semiconductor element formed thereon, the increased density of integration or the like.

On the other hand, the semiconductor device 90 made of the SOI board 1 with two substrates pasted together has factors such as an increased number of processing steps for die-mounting, implementing as a package and the like, which leads to production costs increase.

A method to control the increase of the production cost of the semiconductor device which has a pasted substrates is disclosed in Japanese Patent Laid-Open No. 2001-144173 (Patent literature 2: U.S. Pat. No. 6,879,029 B2). According to the method in Patent literature 2, the semiconductor devices which adopt element isolation structure can be produced without using a pasted SOI substrates, thereby enabling a simplified manufacturing process and preventing an increase of production cost.

The SOI board having the buried oxide film is suitable for the formation of the single sided electrode element such as the semiconductor device 90 as shown in FIG. 15, and the speedup and high density integration are enabled by the insulation separation trench that reaches the oxide film for separation with insulation. On the other hand, the SOI board having the buried oxide film prevents the electric current from flowing in a board cross sectional direction by the buried oxide film. On this account, the SOI board having the buried oxide film is used as a device such as a vertical metal oxide semiconductor transistor element and an IGBT element for large current electricity supply, and is not suitable for forming a double sided electrode element that has a pair of the electrodes for driving the device distributed on both sides of the semiconductor substrate surface. Therefore, many of these vertical metal oxide semiconductor transistor elements and IGBT elements are formed as one chip, and it is difficult to integrate these elements with other elements, thereby leading to production costs increase.

SUMMARY OF THE DISCLOSURE

In view of the above and other problems, the present disclosure provides a semiconductor device and a method for manufacturing the device that has plural active elements or plural passive elements on one semiconductor substrate, with the insulation separation and integration enabled even for a double sided electrode elements, for cost effectiveness.

The semiconductor device with one of plural active elements and plural passive elements formed on one semiconductor substrate, the semiconductor device includes: plural field areas on the semiconductor substrate; and an insulation separation trench that surrounds the plural field areas. The insulation separation trench penetrates the semiconductor substrate for dividing the semiconductor substrate into the plural field areas, and each of the field areas includes one of the plural active elements and plural passive elements. In addition, at least two elements among the plural active elements and the plural passive elements have a pair of power electrodes for power supply disposed on both sides of the semiconductor substrate.

The semiconductor device described above uses bulk single crystal silicon substrate instead of SOI substrate that has a buried oxide film, thereby makes the semiconductor device cost-effective. Further, the semiconductor substrate is divided into plural field areas by the penetrating insulation separation trench, thereby makes it possible to separate and integrate the plural active elements and plural passive elements into respective field areas. Furthermore, due to the use of the bulk single crystal silicon substrate, the double sided electrode elements of at least two pieces or more can be formed on the substrate. Furthermore, the semiconductor device can be manufactured by a disclosed method in a cost-effective manner.

In the above described manner, the semiconductor device having at least two double sided electrode elements of active or passive elements is made possible in terms of insulation separation and integration on one semiconductor substrate.

BRIEF DESCRIPTION OF THE DRAWINGS

Other objects, features and advantages of the present invention will become more apparent from the following detailed description made with reference to the accompanying drawings, in which:

FIGS. 8A and 8B show illustrations of a schematic diagram and a cross section of a semiconductor device;

DETAILED DESCRIPTION

Figure 1:
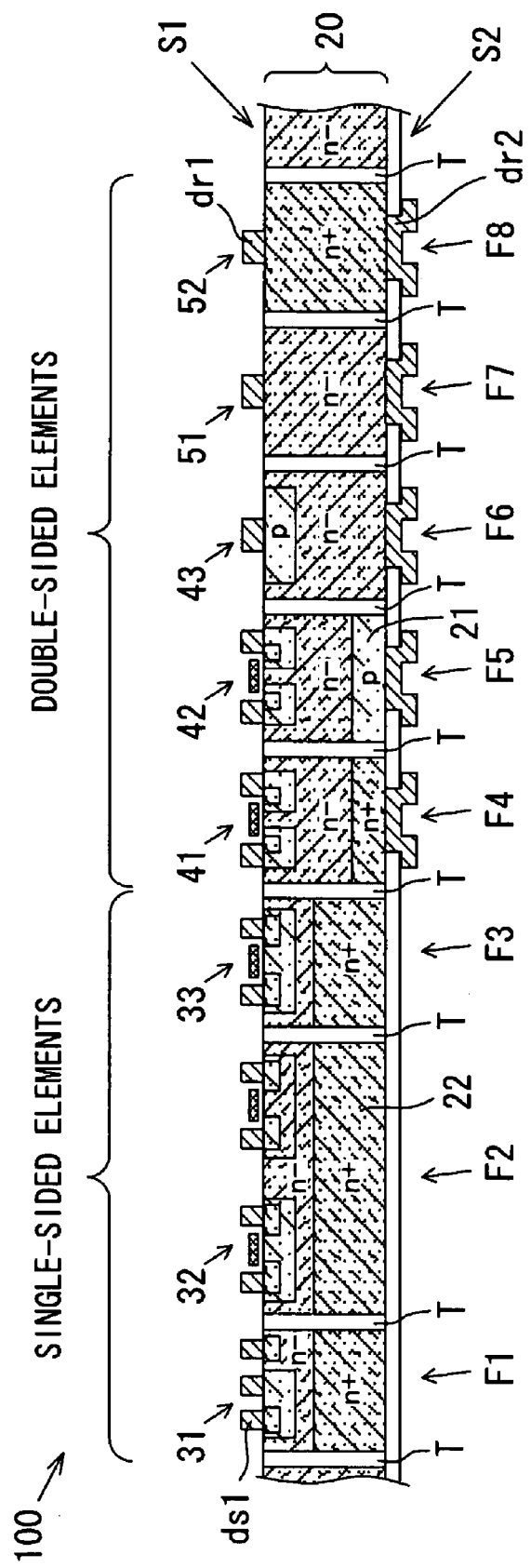
FIG. 1 shows an illustration of a cross section of a semiconductor device in an embodiment of the present disclosure.

The best form to carry out the present invention as follows is explained based on the drawing.

FIG. 1 is an illustration showing a section of a semiconductor device 100 in an embodiment of the semiconductor device of the present invention.

The semiconductor device 100 has active elements 31-33, 41-43 and passive elements 51, 52 formed on one the semiconductor substrate 20. In the semiconductor device 100, active elements are exemplarily represented as a bipolar transistor element 31, a complementary MOS (CMOS, Complementary Metal Oxide Semiconductor) transistor element 32, a horizontal metal oxide semiconductor (MOS) transistor element 33, a vertical metal oxide semiconductor (MOS) transistor element 41, an IGBT (Insulated Gate Bipolar Transistor) element 42 and a diode element 43 is exemplified as a masterpiece of the active element. In addition, passive elements are exemplarily represented as an N conductivity type (n−) low impurity density element 51 to be used as a resistance element and an N conductivity type (n+) high impurity density element 52 to be used as a wiring element in the semiconductor device 100.

A semiconductor substrate 20 used for the semiconductor device 100 consists of the bulk single crystal silicon substrate of the N conductivity type (n−). Active elements 31-33, 41-43 shown in FIG. 1 and the passive elements 51, 52 are not thin film elements. Those elements are the elements which uses the semiconductor substrate 20 consisting of the bulk single crystal silicon substrate of the N conductivity type (n−).

The semiconductor device 100 of FIG. 1 has the semiconductor substrate 20 that are divided into plural field areas F1-F8 by being surrounded by an insulation separation trench T that penetrates the semiconductor substrate 20. The insulation separation trench T may be any one of the following trench types. That is, the trench T may be the insulation separation trench that has the insulators such as the silicon oxide being buried in the trench, the insulation separation trench that has the conductor such as the polycrystalline silicon being buried with a side wall oxide film disposed in the trench, or the insulation separation trench that has a cavity formed with both surfaces covered by a silicon oxide or the like.

The plural active elements 31-33, 41-43 and the passive elements 51, 52 in the semiconductor device 100 are distributed to respectively different field areas F1-F8. In addition, among the plural active elements 31-33, 41-43 and plural passive elements 51, 52 in the above description, the active elements 41-43 exemplified as the vertical metal oxide semiconductor transistor element 41, the IGBT element 42 and the diode element 43 as well as the passive elements 51, 52, that is, the high impurity density element 52 as a resistance element and the low impurity density element 51 as a wiring element, are double sided electrode elements that disperse a pair of electrodes dr1 and dr2 respectively on a first side S1 and a second side S2 of the semiconductor substrate 20 (the electrodes dr1 and dr2 are hatched in FIG. 1). The electrodes dr1, dr2 are used for supplying electric power for the active and passive elements 41-43, 51, 52. That is, the semiconductor device 100 has at least two double sided electrodes elements 41-43, 51, 52. Therefore, on the second side S2 of the semiconductor substrate 20, at least 5 electrodes (i.e., at least the number of double sided electrode elements) are formed. In addition, the active element 31-33 exemplified as the bipolar transistor element 31, the CMOS transistor element 32, and the horizontal metal oxide semiconductor (MOS) transistor element 33 are single sided electrode elements that have a pair of electrodes ds1 disposed only on the first side S1 of the semiconductor substrate 20 (the electrodes ds1 are hatched in FIG. 1). The electrodes ds1 are used for supplying electric power for the active elements 31-33.

In the semiconductor device 100, an impurities diffusion layer 21 of the P conductivity type (p) that is different from the semiconductor substrate 20 of the N conductivity type (n−) and an impurities diffusion layer 22 of the same N conductivity type with different density (n+) are formed at least on the second side S2 of the semiconductor substrate 20. These impurities diffusion layer 21, 22 are respectively formed in a field area F5 and in field areas F1-F4, F8 among the plural field areas F1-F8. In the semiconductor device 100, double sided electrode elements 41-43, 51, 52 having various kinds of characteristics as well as various kinds of active elements 31-33, 41-43 and passive elements 51, 52 can be formed on one semiconductor substrate 20 by forming the impurities diffusion layers 21, 22 having predetermined conductivity type, density and thickness in the field areas F1-F4, F5, F8 in an appropriate manner.

The semiconductor device 100 of FIG. 1 may preferably be used as a semiconductor device for power supply because the double sided electrode elements such as the vertical metal oxide semiconductor transistor element 41 and the IGBT element 42 are formed thereon. Due to use of the bulk single crystal silicon substrate 20 in the semiconductor device 100, larger current capacity and tolerance increase for serge such as ESD is easily achieved. In addition, heat dissipation characteristics can be improved because there is not buried oxide film.

In addition, by employing above insulation separation structure, the semiconductor device 100 can be formed as an composite IC that combines both of the double sided electrode elements such as the vertical metal oxide semiconductor transistor element 41 and the IGBT element 42 and the single sided electrodes elements such as the bipolar transistor element 31 and horizontal metal oxide semiconductor transistor element 33.

Figure 15:
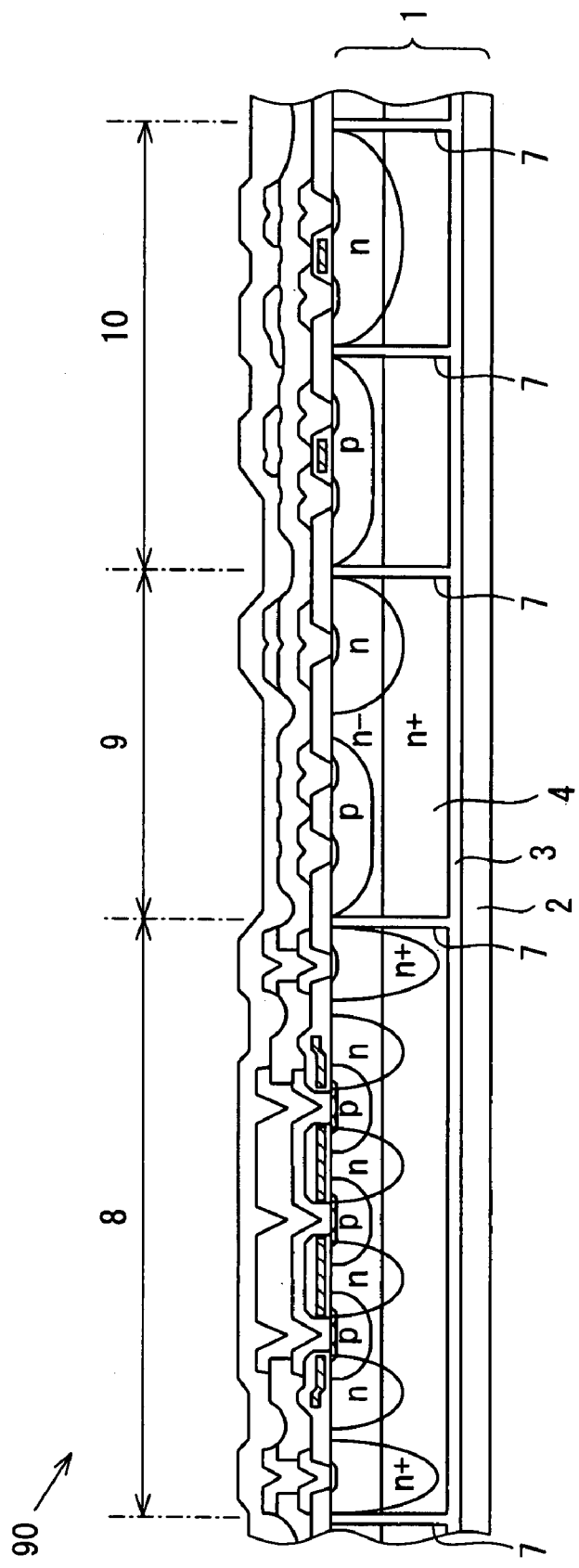
FIG. 15 shows an illustration of a cross section of a conventional semiconductor device.

The semiconductor device 100 achieves the integration structure that is made of the plural active elements 31-33, 41-43 and the passive elements 51, 52 only by using the semiconductor substrate 20 made of the bulk single crystal silicon substrate which is generally available at low costs, instead of using the SOI substrate 1 with the buried oxide film 3 illustrated as the semiconductor device 90 shown in FIG. 15. In addition, the semiconductor substrate 20 shown in FIG. 1 is divided into the plural field areas F1-F8 by the surrounding insulation separation trench T that penetrates the semiconductor substrate 20, and the plural active elements 31-33, 41-43 and passive elements 51, 52 are respectively disposed in different field areas F1-F8 in a dispersing manner. Therefore, in the semiconductor device 100, the plural active elements 31-33, 41-43 and the passive elements 51, 52 are insulated from each other by the insulation separation trench T that penetrates the semiconductor substrate 20 for integration. In addition, integration is made possible even if the active element 41-43 and the passive elements 51, 52 are the double sided electrode elements mentioned above because the bulk single crystal silicon substrate without buried oxide film can be used as the semiconductor substrate 20. Furthermore, the semiconductor device 100 can be produced cost-effectively by a manufacturing method mentioned later.

Figure 2:
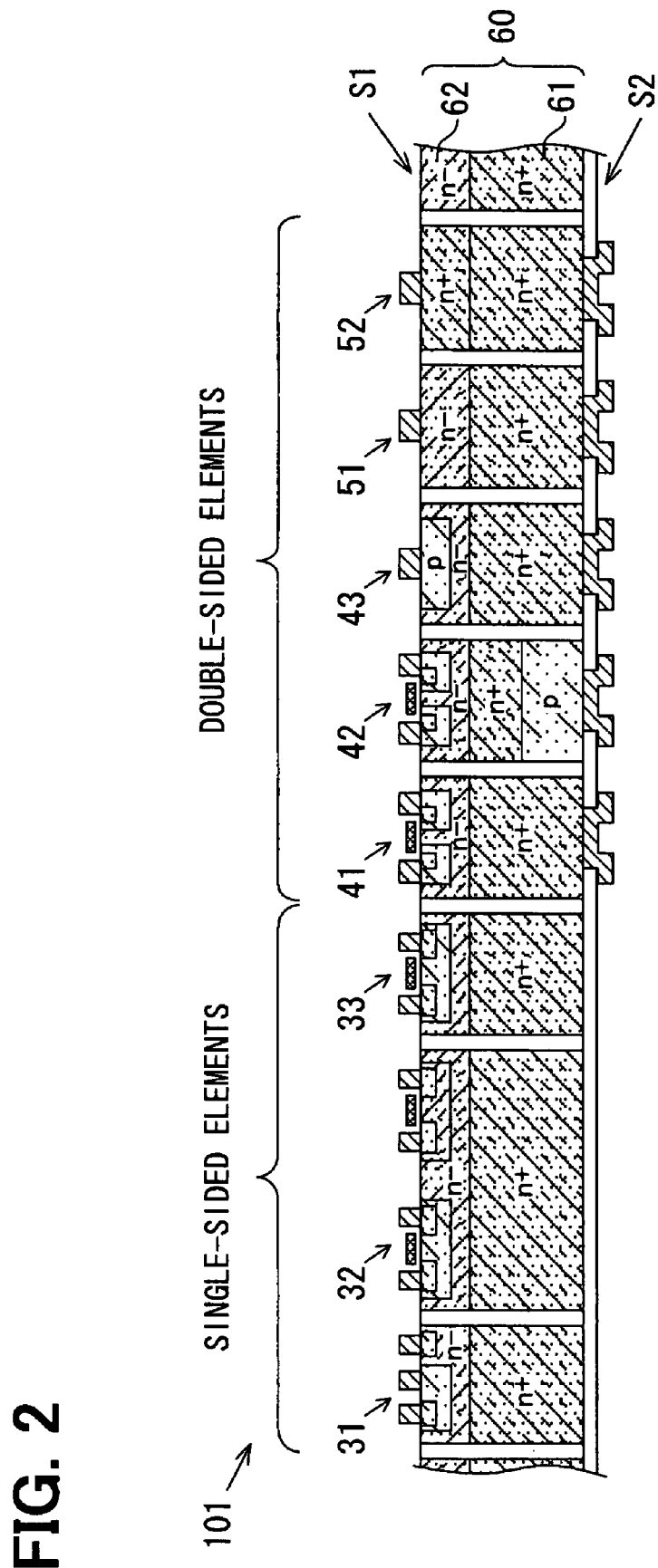
FIG. 2 shows an illustration of a cross section of a semiconductor device.

FIG. 2 is an illustration of another semiconductor device, that is, a semiconductor device 101 shown in a cross-sectional view. In this case, in the semiconductor device 101 of FIG. 2, like parts have like numbers as the semiconductor device 100 of FIG. 1.

The semiconductor device 100 of FIG. 1 is formed on the semiconductor substrate 20 consisting of the bulk single crystal silicon substrates of the N conductivity type (n−). In contrast, semiconductor device 101 of FIG. 2 is formed on a semiconductor substrate 60 consisting of the epitaxial substrates which has a silicon epitaxial layer 62 of the N conductivity type (n−) on the bulk single crystal silicon substrate 61 of the N conductivity type (n+).

It is necessary for the semiconductor substrate 20, 60 in the semiconductor device 100, 101 shown in FIGS. 1 and 2 to have predetermined thickness due to a requirement of strength for handling in the manufacturing processes. In addition, when, for example, double sided electrode element for power circuits such as the vertical metal oxide semiconductor transistor element 41 and the IGBT element 42 is formed, an (n−) carrier drift layer that has lower impurity density is required for high tolerance voltage. On the other hand, an (n+) drift layer that has higher impurity density is required to make the element to become a low ON resistance element. Therefore, when the bulk single crystal silicon substrate 61 of the N conductivity type (n+) is used as a supporting substrate for providing strength for the epitaxial substrate 60 in the semiconductor device 101 of FIG. 2 with the silicon epitaxial layer 62 of the N conductivity type (n−) that has appropriate set thickness and impurity density serving as the carrier drift layer, high tolerance voltage and/or low ON resistance double sided electrode element can be formed as the carrier drift layer.

In addition, even in the semiconductor device 101 of FIG. 2, plural active elements 31-33, 41-43 and the passive elements 51, 52 are respectively disposed in different field areas just like the semiconductor device 100 of FIG. 1. Further, the semiconductor device 101 of FIG. 2 has more than two double sided electrode elements 41-43, 51, 52, thereby having at least five (i.e., the number of the double sided electrode elements) electrodes on the second side S2 of the semiconductor substrate 60.

As described above, both of the semiconductor devices 100 and 101 are, as shown in FIGS. 1 and 2, the semiconductor device that can be manufactured cost-effectively by enabling the insulation separation for the at least two double sided electrode elements when plural active/passive elements are formed on one semiconductor substrate.

A manufacturing method of the semiconductor devices 100,101 shown in FIG. 1, FIG. 2 is explained in the following.

FIGS. 3A to 3E are cross sections of each of manufacturing steps of a semiconductor device 102 which is an simplified version of the semiconductor device 100 of FIG. 1. In the semiconductor device 102 shown in FIG. 3E, a vertical metal oxide semiconductor transistor element 41 as and an IGBT element 42 as double sided electrode elements are formed. In this case, in the semiconductor device 102 of FIG. 3E, like parts have like numbers as the semiconductor device 100 of FIG. 1.

Figure 3A:
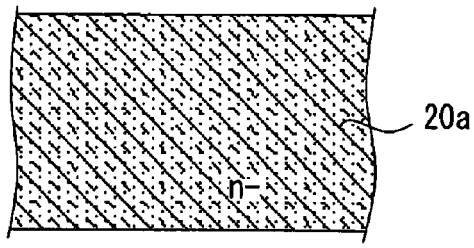
FIGS. 3A to 3E show illustrations of cross sectional manufacturing process of a semiconductor device.

The semiconductor substrate 20*a* of the predetermined thickness for element formation (for example, 400 μm) is prepared for in substrate preparation step shown in FIG. 3A first on producing semiconductor device 102.

Figure 3B:
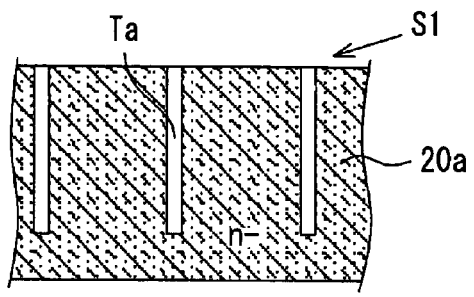

Next, in a non-penetration insulation separation trench formation process shown in FIG. 3B, a non-penetration insulation separation trench Ta is formed with appointed depth (for example, 150 μm) from the first side S1 surface of the semiconductor substrate for element formation so that each of the field areas F4 and F5 is surrounded by the trench T. The Non-penetration insulation separation trench Ta may be any one of the following trenches. That is, the trench may be a trench with an insulator buried therein, a trench with a buried conductor with a side wall oxide film, or a trench with a hollow formed therein. In this case, when a trench with a hollow is formed in the trench Ta, an opening on the first side S1 surface of the trench Ta is covered by the insulator in a first side element formation process shown in FIG. 3C in the following.

Figure 3C:
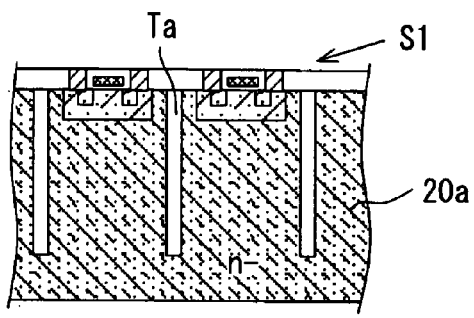

Next, in the first side element formation process shown in FIG. 3C, processes required to form each part the vertical metal oxide semiconductor transistor element 41 and the IGBT element 42 on the first side S1 of the semiconductor substrate 20*a* are carried out.

Figure 3D:
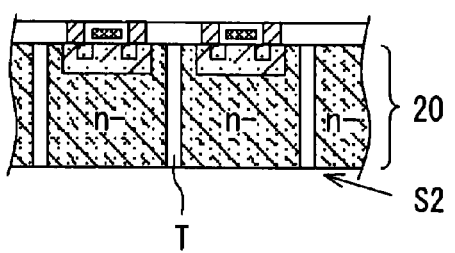

Next, in a substrate abrasion process shown in FIG. 3D, the semiconductor substrate 20*a* for element formation is polished from the second side S2 side so that a tip of a non-penetration insulation separation trench Ta is exposed, that is, for example, the substrate is polished to have thickness of 120 μm. In this case, the polished surface is preferably wet etched after mechanical polishing for removing the damage layer. By the above process, the semiconductor substrate 20*a* for element formation becomes the semiconductor substrate 20 of the predetermined thickness with the non-penetration insulation separation trench Ta formed as the insulation separation trench T that penetrates the semiconductor substrate 20.

Figure 3E:
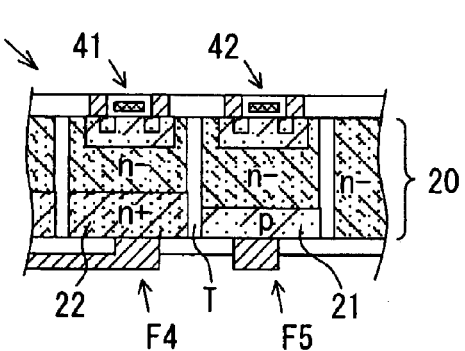

Finally, an ion implantation process to form impurities diffusion layer 21,22 on the second side S2 of the semiconductor substrate 20 in a second side element formation process shown in FIG. 3E that comes after the substrate abrasion process is performed as well as other required processes for forming each part of the vertical metal oxide semiconductor transistor element 41 and the IGBT element 42 on the second side S2 as the double sided electrode elements.

The semiconductor device 102 is manufactured in the above-described manner.

In this case, in the manufacturing method of the semiconductor device 102 shown in FIGS. 3A to E, the first side element formation process shown in FIG. 3C is carried out between the non-penetration insulation separation trench formation process of FIG. 3B and the substrate abrasion process of FIG. 3D. The first side element formation process in the manufacturing method of the above semiconductor device 102 may be carried out, for example, before the non-penetration insulation separation trench formation process of FIG. 3B or after the substrate abrasion process of FIG. 3D. However, bad influence to the element formation from the execution of the non-penetration insulation separation trench formation process of FIG. 3B can be prevented by carrying out the first side element formation process after the non-penetration insulation separation trench formation process of FIG. 3B. Further, by carrying out the first side element formation process before the substrate abrasion process of FIG. 3D, the first side element formation process is performed on the substrate 20 which is still in an easy handling condition with its thickness not yet decreased by polishing.

The manufacturing method of semiconductor device 102 shown in FIGS. 3A to 3E consists only of general processing to the bulk single crystal silicon substrate. That is, in other words, the manufacturing process of the device 102 does not require a special process for forming the vertical metal oxide semiconductor transistor element 41 and the IGBT element 42 on one semiconductor substrate 20. In addition, the manufacturing process is simplified because an inexpensive bulk single crystal silicon substrate is used to have the penetrating insulation separation trench on the substrate 20 for forming insulation separation between the vertical metal oxide semiconductor transistor element 41 and the IGBT element 42. This is because, as described for the process of the semiconductor device 90 of FIG. 15, use of the SOI substrate having the buried oxide film that necessitates a substrate pasting process is avoided.

In addition, even when the semiconductor device 102 that includes double sided electrode elements such as the transistor element 41 and IGBT element 42 is manufactured, the manufacturing process shown in FIGS. 3A to 3E forms those elements 41 and 42 by the first side element formation process of FIG. 3C performed on the first side S1 of the substrate 20a and by the second side element formation process of FIG. 3E performed on the second side S2 of the semiconductor substrate 20 after the substrate abrasion process, thereby enabling production of the semiconductor device 102 that includes the double sided electrode elements.

The manufacturing method of the semiconductor device 102 shown in FIGS. 3A to 3E can be summarized as the manufacturing method that enables production of the semiconductor device having at least two double sided electrode elements among plural active and passive elements on one semiconductor substrate with the enablement of the insulation separation and integration even for the double sided electrode elements at lower production costs.

In addition, in the manufacturing method of the semiconductor device 102 shown in FIGS. 3A to 3E, a bulk single crystal silicon substrate is used for element formation of the semiconductor device 102. That is, the semiconductor device 102 is, just as the semiconductor device 100 in FIG. 1, the device formed on the bulk single crystal silicon substrate. On the other hand, the semiconductor device formed on the epitaxial substrate in the same manner as the semiconductor device 101 shown in FIG. 2 is manufactured by the manufacturing method that is shown in FIGS. 3A to 3E. In this case, in the substrate preparation process shown in FIG. 3A, the epitaxial substrate which has a silicon epitaxial layer formed on a bulk single crystal silicon substrate is prepared as the semiconductor substrate for element formation, and each of the processes in FIGS. 3B to 3E may be performed so that the semiconductor substrate has the silicon epitaxial layer on the first side S1 surface of the substrate.

Semiconductor devices similar to the semiconductor devices 100-102 respectively shown in FIG. 1-FIG. 3E are describe in the following, regarding application forms such as the implementation to a connection wiring and a circuit substrate.

Figure 4:
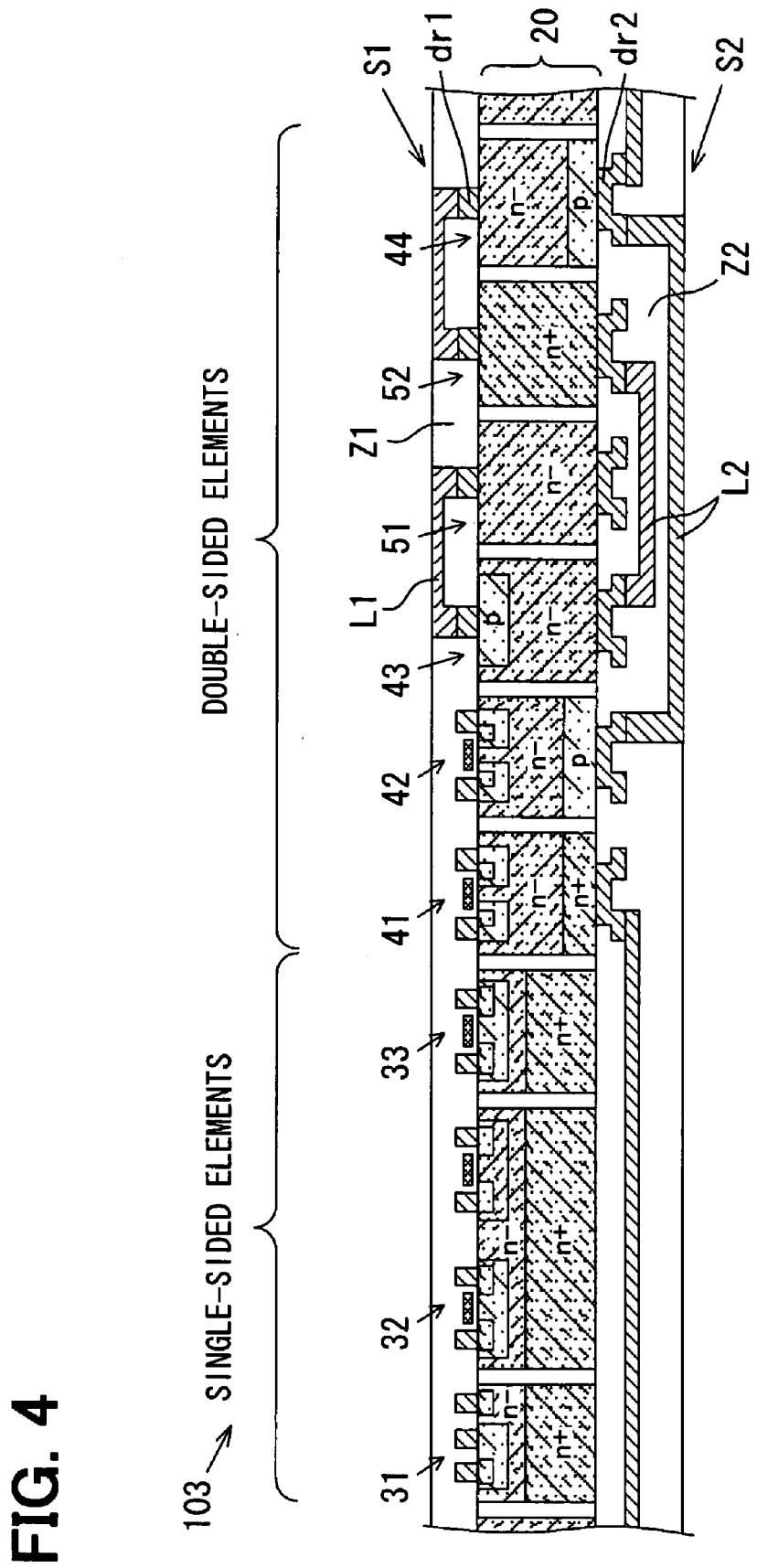
FIG. 4 shows an illustration of a cross section of a semiconductor device with wiring for a double sided electrode element.

FIG. 4 is an illustration of a section of a semiconductor device 103 to show an example of the connection wiring in each of the double sided electrode element formed on the device 103. In addition, in the semiconductor device 103 of FIG. 4, like parts have like numbers as the semiconductor device 100 of FIG. 1.

The double sided electrode elements 41-44, 51, 52 in the semiconductor device 103 of FIG. 4 are, as described above, the elements that have a pair of electrodes for driving the elements 41-44, 51, 52 on both sides of the semiconductor substrate 20. That is, the electrode dr1 and the electrode dr2 are distributed respectively on the first side S1 and the second side S2. On this account, with the semiconductor device 103 having the double sided electrode elements 41-44, 51, 52 has wirings L1, L2 formed through layer insulation films Z1, Z2 on both of the first side S1 and the second side S2 of the semiconductor substrate. In addition, a high impurity density element 52 as a wiring element is used to connect the second side S2 side to the first side S1 of the semiconductor substrate 20.

Figure 5A:
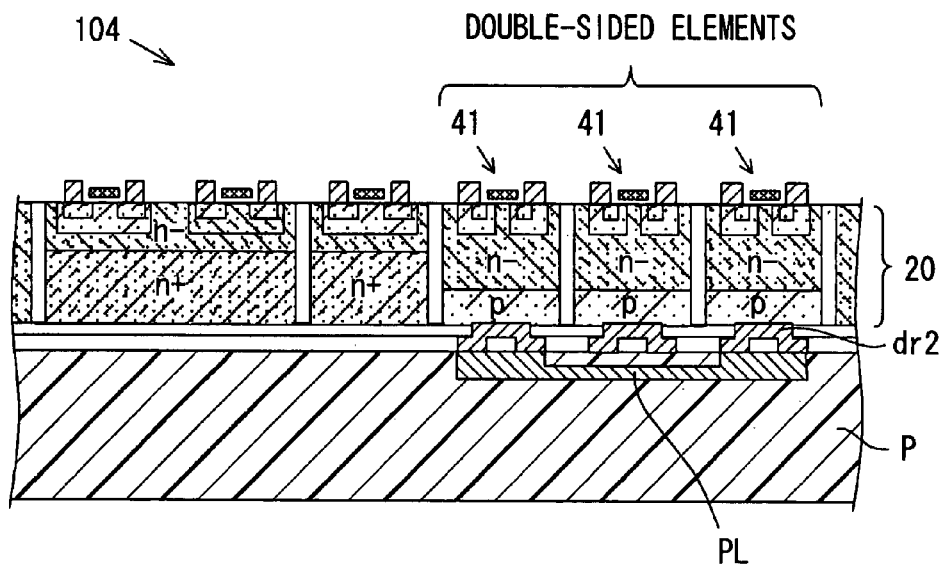
FIGS. 5A and 5B show illustrations of a cross section of an implementation of a semiconductor device on a circuit board P.

FIGS. 5A, B respectively show an illustration of a cross section of semiconductor device 104 that is in an implementation state to the circuit substrate P. In addition, in the semiconductor device 104 of FIGS. 5A/B, like parts have like numbers as the semiconductor device 100 of FIG. 1.

In FIG. 5A, the electrode dr2 on the second side S2 of the double sided electrode element 41 formed on the semiconductor device 104 is connected to another electrode dr2 by a wiring PL disposed on the circuit substrate P. The electrode on the second side of the double sided electrode element on the semiconductor device of the present invention may use the wiring of the circuit substrate for connection to the circuit substrate when the semiconductor device is implemented.

Figure 5B:
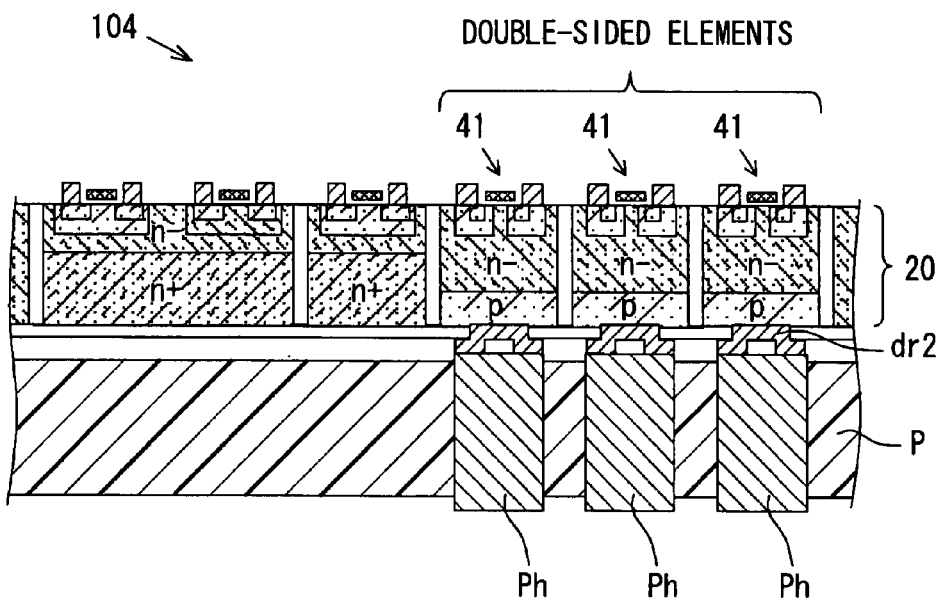

In FIG. 5B, the electrode dr2 of the second side S1 of the double sided electrode element 41 formed on the semiconductor device 104 is connected to a heat sink Ph disposed on the circuit substrate P. The electrode on the second side S2 of the double sided electrode element formed of the semiconductor device of the present invention is connected to the heat sink of the circuit substrate side for heat dissipation.

Next, regarding the semiconductor device similar to the devices 100-104 respectively shown in FIG. 1-FIGS. 5A/B, a concrete application form is explained.

Figure 6A:
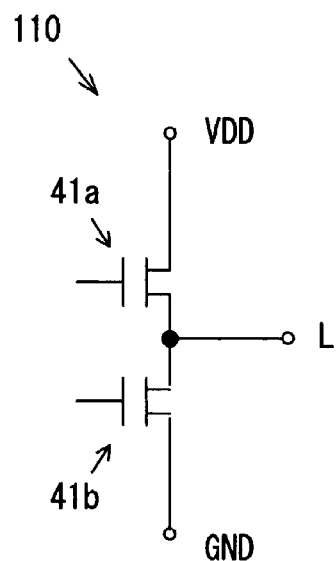
FIGS. 6A and 6B show illustrations of a schematic diagram and a cross section of a semiconductor device.
Figure 6B:
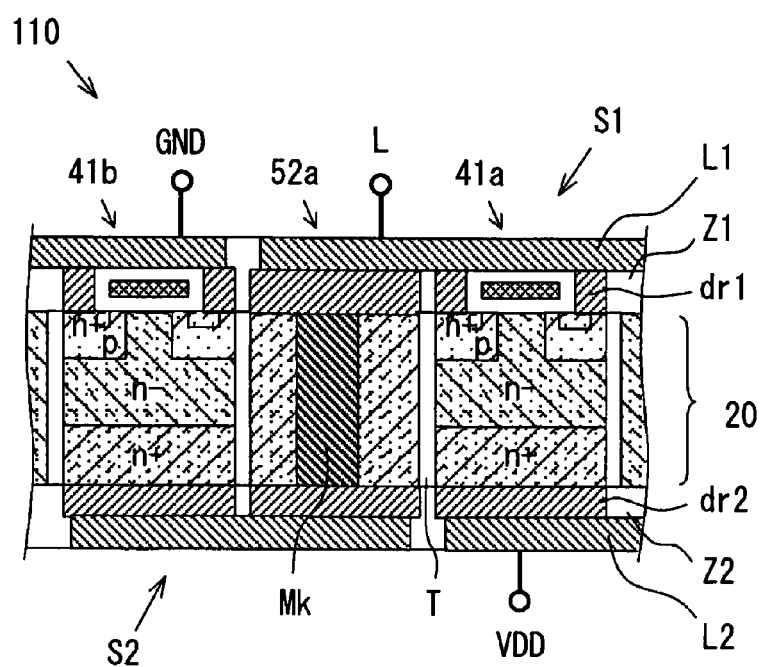

In FIGS. 6A and 6B, a semiconductor device 110 having a half bridge circuit is shown. That is, FIG. 6A is an equivalent circuit schematic of the semiconductor device 110, and FIG. 6B is an illustration of a cross section of the semiconductor device 110. In addition, like parts have like numbers in the semiconductor device 110-115 shown in FIGS. 6A/B-FIGS. 11A/B as the semiconductor device 100-104 shown in FIG. 1-FIGS. 5A/B.

In the semiconductor device 110 shown in FIGS. 6A/B, two vertical metal oxide semiconductor transistor elements 41a, 41b having the same structure are formed as the double sided electrode element on the semiconductor substrate 20. As for the two vertical metal oxide semiconductor transistor element 41a, 41b, the elements 41a and 41b are connected in series connection through the double sided electrode element 52a functioning as the wiring element that has buried metal Mk penetrating the semiconductor substrate 20 formed thereon as shown in FIG. 6B. A half bridge circuit shown in FIG. 6A consists of two vertical metal oxide semiconductor transistor elements 41a, 41b connected in series connection, and the output of the half bridge circuit is taken out from a connection point of the two vertical metal oxide semiconductor transistor elements 41a, 41b. In addition, an output terminal L of the semiconductor device 110 having the half bridge circuit is disposed on the first side S1 which is a source side of the vertical metal oxide semiconductor transistor element 41a in FIG. 6B. However, the terminal L can be disposed on the second side S2 which is a drain side of the vertical metal oxide semiconductor transistor element 41b.

Figure 7A:
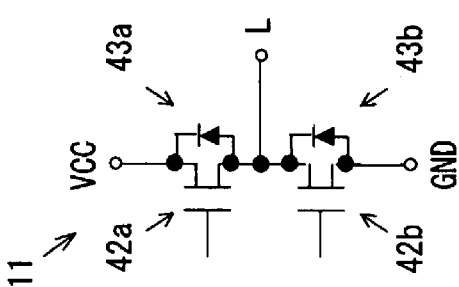
FIGS. 7A and 7B show illustrations of a schematic diagram and a cross section of a semiconductor device.
Figure 7B:
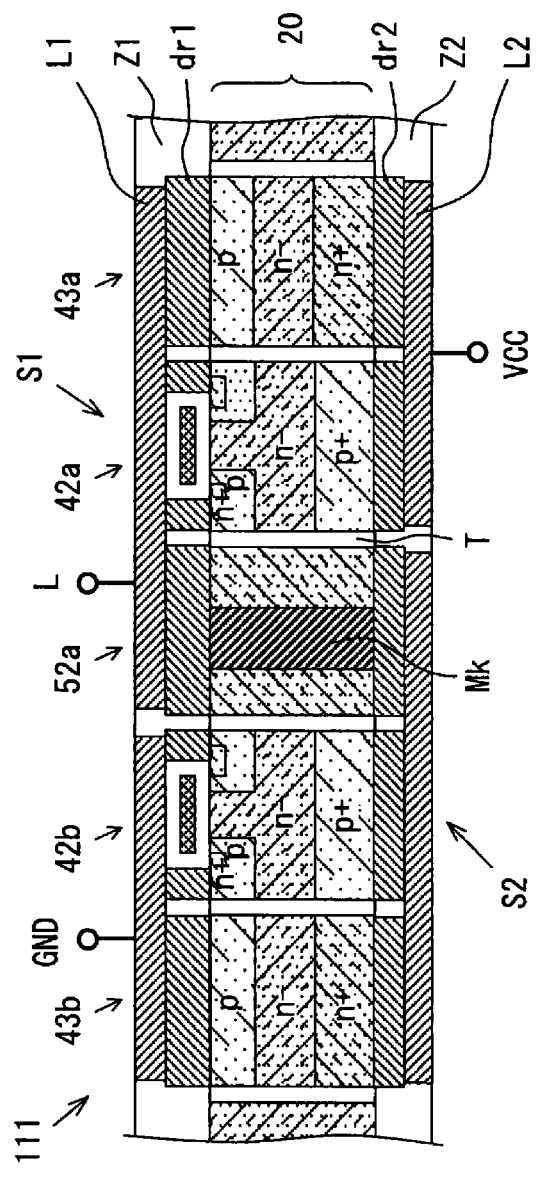

In FIGS. 7A and 7B, another semiconductor device 111 having the half bridge circuit is illustrated. That is, FIG. 7A is an equivalent circuit schematic of the semiconductor device 111, and FIG. 7B is an illustration of a cross section of the semiconductor device 111.

In the semiconductor device 111 shown in FIGS. 7A/B, two identically-structured IGBT elements 42a, 42b are formed as the double sided electrode element on the semiconductor substrate 20. In addition, with the semiconductor device 111, diode elements 43a, 43b which are also double sided electrode elements, are connected in parallel connection respectively to each to IGBT elements 42a, 42b. The diode elements 43a, 43b connected in parallel connection to each of the IGBT elements 42a, 42b can be used as so-called free wheel diode (FWD) in a power module of the three-phase circuit inverter as mentioned later. In addition, in the semiconductor device 110 shown in FIGS. 6A/B, the diode element 43a, 43b can also be connected in the same manner.

As for two IGBT element 42a, 42b in the semiconductor device 111 of FIGS. 7A/B, a double sided electrode element 52a functioning as a wiring element in FIG. 7B is used to connect two elements 42a and 42b in series, as in the semiconductor device 110 of FIGS. 6A/B. A half bridge circuit shown in FIG. 7A consists of the two IGBT element 42a, 42b connected in series connection, and the output of the half bridge circuit is taken out from the connecting point between the two IGBT elements 42a, 42b in series connection. In addition, the output terminal L of the half bridge circuit in the semiconductor device 111 of FIGS. 7A/B may be disposed on either of the first side S1 which is an emitter side of IGBT element 42a or the second side S2 which is a collector side of IGBT element 42b.

The semiconductor device 112 in FIGS. 8A, 8B is an H bridge circuit. FIG. 8A is an equivalent circuit schematic of the semiconductor device 112, and FIG. 8B is an illustration of a cross section of the semiconductor device 112.

The semiconductor device 112 shown in FIGS. 8A/B is an equivalent to two sets of the half bridge circuit of the semiconductor device 110 shown in FIGS. 6A/B. In the semiconductor device 112, four identically-structured vertical metal oxide semiconductor transistor elements 41a-41d are formed as the double sided electrode element on the semiconductor substrate 20, and two vertical metal oxide semiconductor transistor elements 41a, 41b and 41c, 41d are paired, as shown FIG. 8B, to be connected in series connection through the double sided electrode elements 52a, 52b functioning as a wiring element. The two sets of paired vertical metal oxide semiconductor transistor elements 41a, 41b and 41c, 41d are connected in parallel connection to form an H bridge circuit shown in FIG. 8A, and the output of the H bridge circuit is taken out from each of the connecting points of two sets of paired transistor elements 41a, 41b and 41c, 41d. In addition, even in the semiconductor device 112, the output terminals L1, L2 of the H bridge circuit are disposed on the first side S1 which is a source side of the vertical metal oxide semiconductor transistor elements 41a, 41c in FIG. 8B. However, the output terminals L1, L2 may be disposed on the second side S2 which is a drain side of the vertical metal oxide semiconductor transistor element 41b, 41d.

Figure 9A:
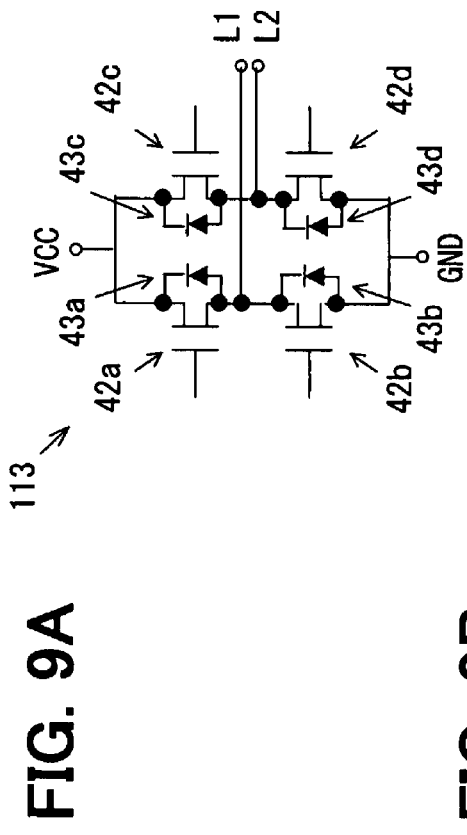
FIGS. 9A and 9B show illustrations of a schematic diagram and a cross section of a semiconductor device.
Figure 9B:
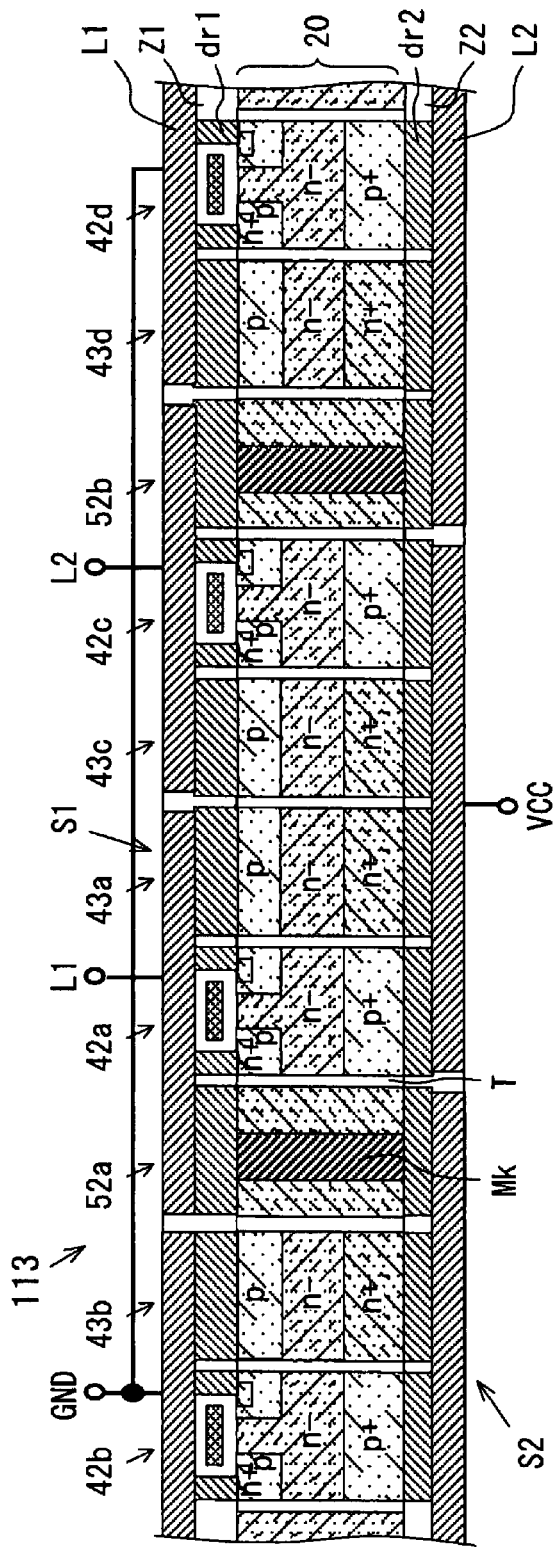

In FIGS. 9A, 9B, another semiconductor device 113 forming the H bridge circuit is illustrated. That is, FIG. 9A is an equivalent circuit schematic of the semiconductor device 113, and FIG. 9B is an illustration of a cross section of the semiconductor device 113.

The semiconductor device 113 shown in FIGS. 9A, 9B is an equivalent to two sets of the half bridge circuit of the semiconductor device 111 shown in FIGS. 7A/B. In the semiconductor device 113, four identically-structured IGBT elements 42a-42d are formed as the double sided electrode element on the semiconductor substrate 20. In addition, for each of the IGBT elements 42a-42d, each of diode elements 43a-43d which is another double sided electrode element is connected in parallel connection. Further, even in the semiconductor device 113, output terminals L1, L2 of the H bridge circuit are disposed on the first side S1 which is an emitter side of the IGBT elements 42a, 42c in FIG. 9B. However, the terminals L1, L2 may be disposed on the second side S2 which is a collector side of the IGBT elements 42b, 42d.

Similarly, the semiconductor device may be used as a power module of the three-phase circuit inverter. In this case, three sets of half bridge circuit as shown in FIGS. 6A/B and FIGS. 7A/B as the semiconductor devices 110, 111 may be employed. Each phase output of the three-phase inverter is taken out from the connecting point of two vertical metal oxide semiconductor transistor elements or two IGBT elements connected in series connection in these three sets of half bridge circuits. The semiconductor device used as a power module of the three-phase circuit inverter is described later in detail.

The H bridge circuit shown in FIG. 8A and FIG. 9A may have a different structure by using a semiconductor device similar to the semiconductor devices 100-104 shown in FIG. 1-FIGS. 5A/B.

Figure 10A:
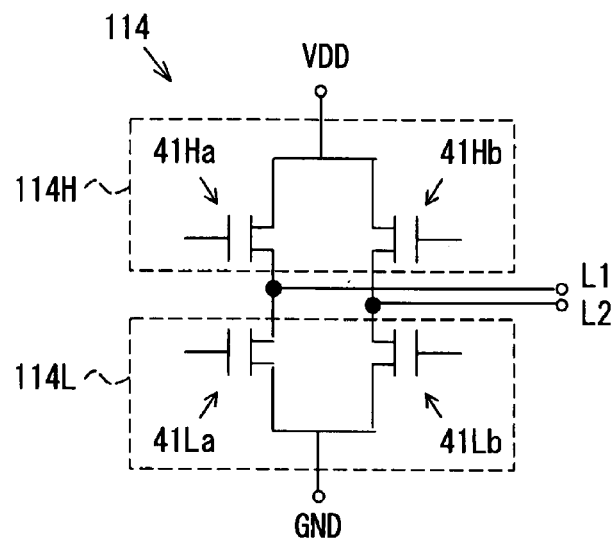
FIGS. 10A and 10B show illustrations of a schematic diagram and a cross section of a semiconductor device.
Figure 10B:
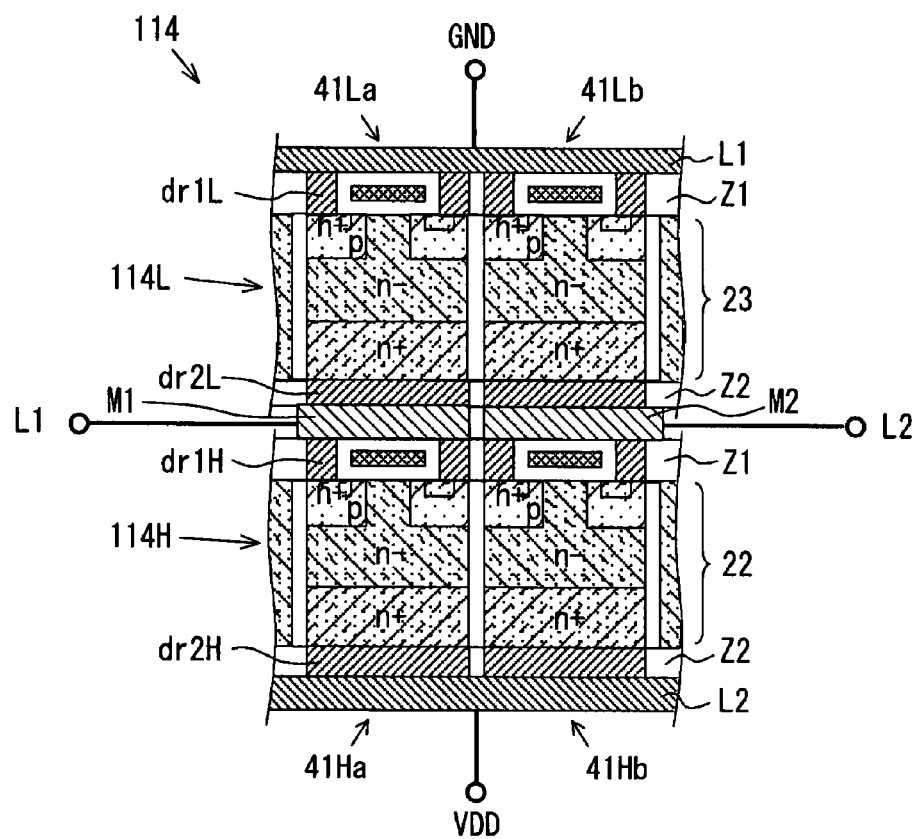

A semiconductor device 114 for forming an H bridge circuit is shown in FIGS. 10A and 10B. That is, FIG. 10A is an equivalent circuit schematic of the semiconductor device 114, and FIG. 10B is an illustration of a cross section of the semiconductor device 114.

As shown in FIG. 10A, the equivalent circuit schematic of the semiconductor device 114 is basically same as the equivalent circuit schematic of the semiconductor device 112 shown in FIG. 8A. On the other hand, the semiconductor device 114 shown in FIGS. 10A/B consists of the semiconductor device 114H, 114L formed respectively on the semiconductor substrates 22, 23 for forming the H bridge circuit as a pair, contrary to the semiconductor device 112 shown in FIGS. 8A/B which has the H bridge circuit on one semiconductor substrate 20.

In the semiconductor devices 114H, 114L, two identically-structured vertical metal oxide semiconductor transistor elements 41Ha, 41Hb and 41La, 41Lb are respectively formed as the double sided electrode element on the semiconductor substrate 22, 23. Two semiconductor devices 114H, 114L are layered with two leads M1, M2 being bound therebetween as shown in FIG. 10B. Further, the vertical metal oxide semiconductor transistor elements 41Ha, 41La and 41Hb, 41Lb are respectively paired with the same elements through the leads M1, M2 in series for forming the H bridge circuit. From the leads M1, M2, the output of the H bridge circuit is taken out.

Figure 11A:
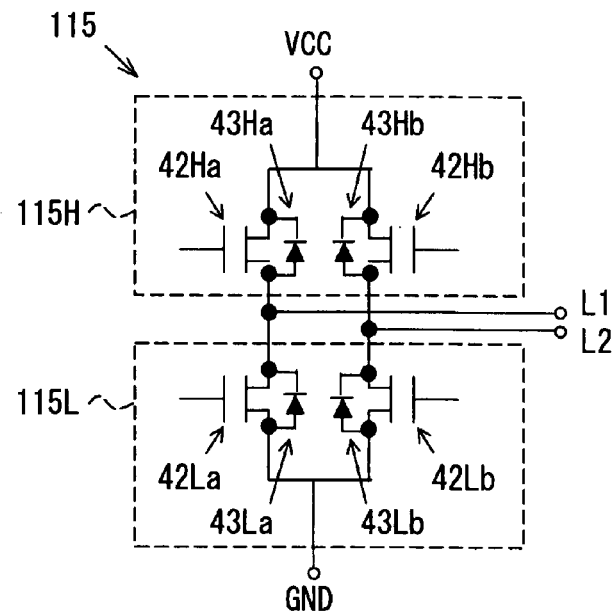
FIGS. 11A and 11B show illustrations of a schematic diagram and a cross section of a semiconductor device.
Figure 11B:
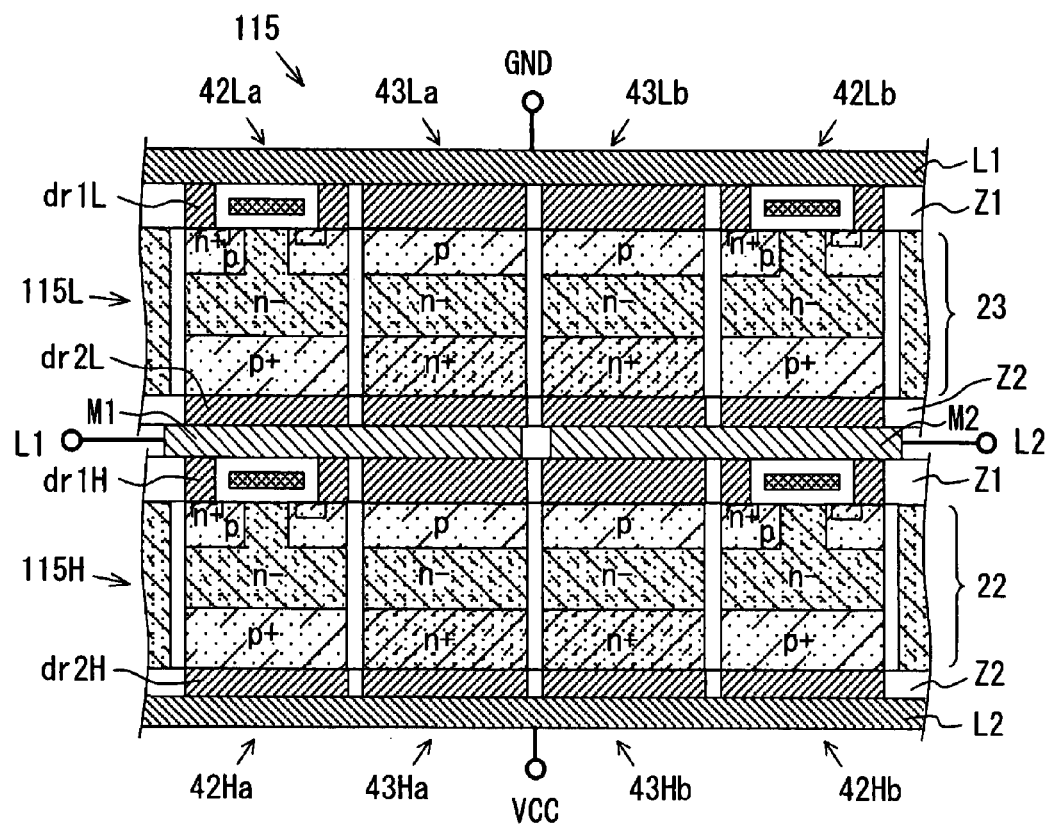

FIGS. 11A and 11B show another semiconductor device 115 for forming the H bridge circuit. That is, FIG. 11A is an equivalent circuit schematic of the semiconductor device 115, and FIG. 11B is an illustration of a cross section of the semiconductor device 115.

As shown in FIG. 11A, the equivalent circuit schematic of the semiconductor device 115 is basically same as the equivalent circuit schematic of the semiconductor device 113 shown in FIG. 9A. On the other hand, in the semiconductor device 113 shown in FIGS. 9A/B, the H bridge circuit is formed on one semiconductor substrate 20. This is in contrast to the semiconductor device 115 in FIGS. 11A/B that forms the H bridge circuit as a pair of two semiconductor devices 115H, 115L that are respectively formed on the semiconductor substrate 22, 23.

In the semiconductor devices 115H, 115L, two identically-structured IGBT elements 42Ha, 42Hb and 42La, 42Lb are respectively formed as the double sided electrode element on the semiconductor substrates 22, 23. In addition, for each of the IGBT elements 42Ha, 42Hb, 42La, 42Lb, diode elements 43Ha, 43Hb, 43La, 43Lb are respectively connected in parallel connection. Two semiconductor devices 115H, 115L are layered, as shown in FIG. 11B, with two leads M1, M2 being bound therebetween. Further, the IGBT elements 42Ha, 42La and the IGBT elements 42Hb, 42Lb are connected in series connection respectively through the leads M1, M2 for forming the H bridge circuit. From the leads M1, M2, the output of the H bridge circuit is taken out.

In addition, similarly as the semiconductor devices 114, 115 respectively shown in FIGS. 10A/B and FIGS. 11A/B, two of the semiconductor devices are paired for forming the half bridge circuit or a power module of the three-phase circuit inverter.

In addition, though only an essential part of the semiconductor devices 110-115 are illustrated respectively in FIGS. 6A/B-FIGS. 11A/B, another double sided electrode element and single sided electrode element may be formed at different positions of the semiconductor substrates 20, 22, 23 as the semiconductor devices 100-104 respectively shown in FIG. 1-FIGS. 5A/B. If, for example, the double sided electrode elements are the power elements for power supply as the semiconductor devices 110-115 shown in FIGS. 6A/B-FIGS. 11A/B, the single sided electrodes may be, for example, formed at different positions of the semiconductor substrate for controlling the double sided electrode elements. In this manner, the semiconductor device is formed as a composite IC that has the power element for power supply and the single sided electrode element for controlling the power element formed on one semiconductor substrate.

The semiconductor device similar to the semiconductor devices 100-104 respectively shown in FIG. 1-FIGS. 5A/B, are described in the following in terms of application to the power module of the three-phase circuit inverter for power supply.

Figure 12:
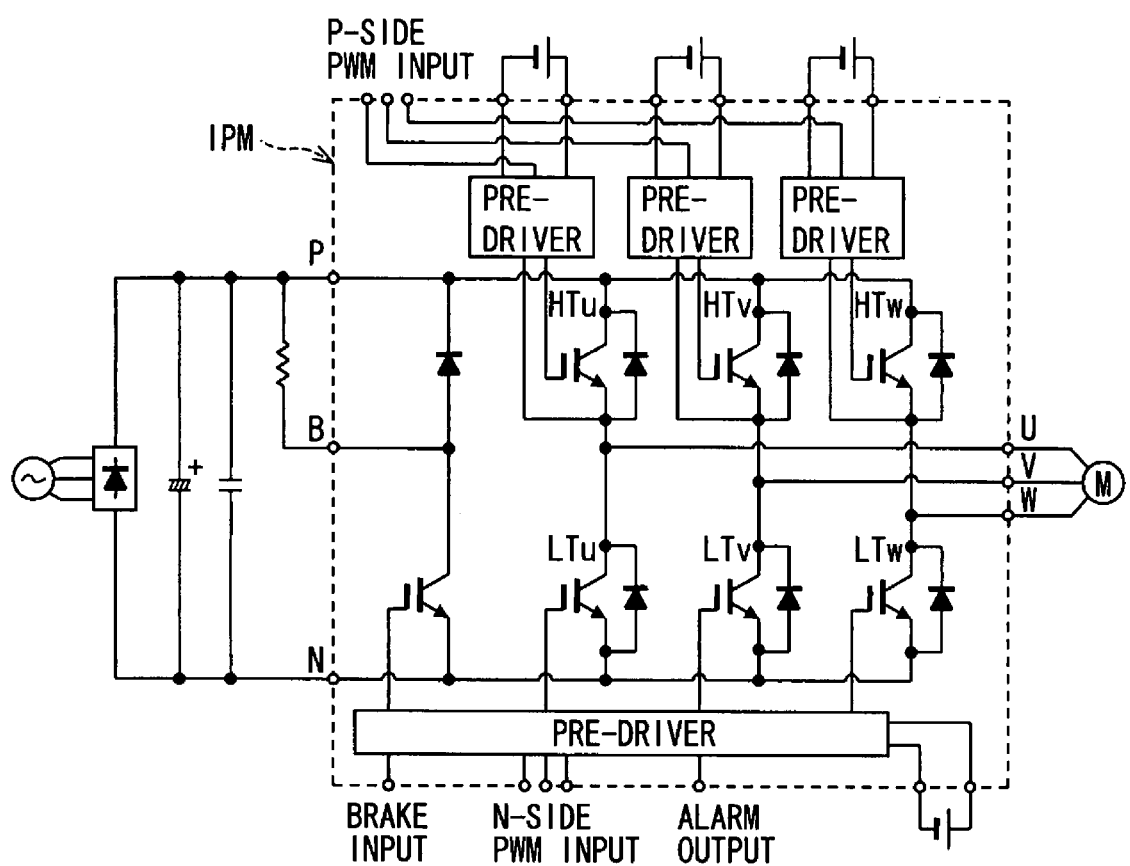
FIG. 12 shows a schematic diagram of an inverter power module.

FIG. 12 is a circuit diagram of the power module (IPM) of the three-phase circuit inverter.

As shown in FIG. 12, the power module (IPM) of the three-phase circuit inverter surrounded in a dotted line has three pairs of series-connection power transistors (HTu, LTu), (HTv, LTv), (HTw, LTw). Each of the three phases u, v, w from the three phase alternative current are respectively taken out from the connecting point between sources of three high voltage side power transistors HTu, HTv, HTw and drains of three low voltage power transistors LTu, LTv, LTw. In addition, each of the transistors HTu, HTv, HTw, LTu, LTv, LTw for power supply is driven by an input signal from a driver circuit to a gate.

Figure 13:
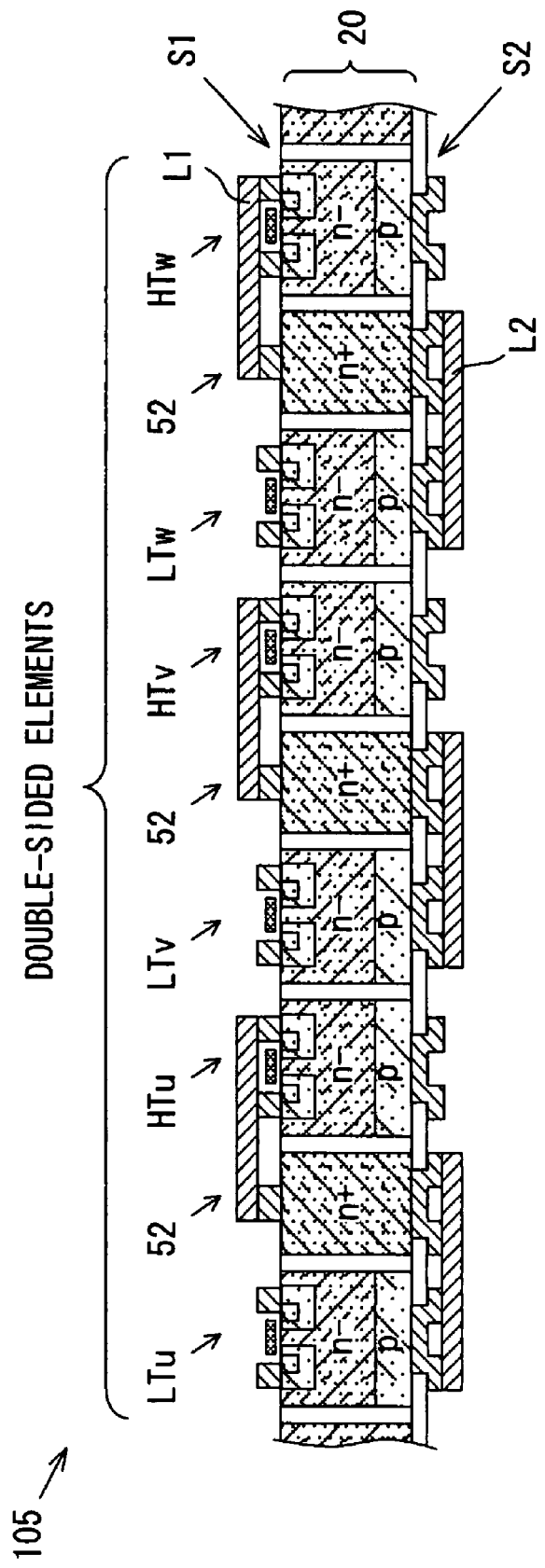
FIG. 13 shows an illustration of a cross section of a semiconductor device having the inverter power module.

FIG. 13 shows an example of the semiconductor device forming a power module (IPM) of the three-phase circuit inverter of FIG. 12. That is, FIG. 13 is an illustration of a cross section of the semiconductor device 105. In addition, in the semiconductor device 105 of FIG. 13, like parts have like numbers as the semiconductor device 100 of FIG. 1.

The semiconductor device 105 of FIG. 13 is the semiconductor device that has transistors HTu, HTv, HTw, LTu, LTv, LTw respectively shown in of FIG. 12 formed as the double sided electrode element on one semiconductor substrate 20 for power supply. In the semiconductor device 105, three power transistors HTu, HTv, HTw on the high voltage side and three power transistors LTu, LTv, LTw on the low voltage side are respectively connected by the wiring L1 on the first side S1, by the high impurity density element 52 and by the wiring L2 on the second side S2. In addition, the driver circuit shown in FIG. 12 can be formed at the different position of the semiconductor substrate 20 by using the single sided electrode element or the like.

Figure 14:
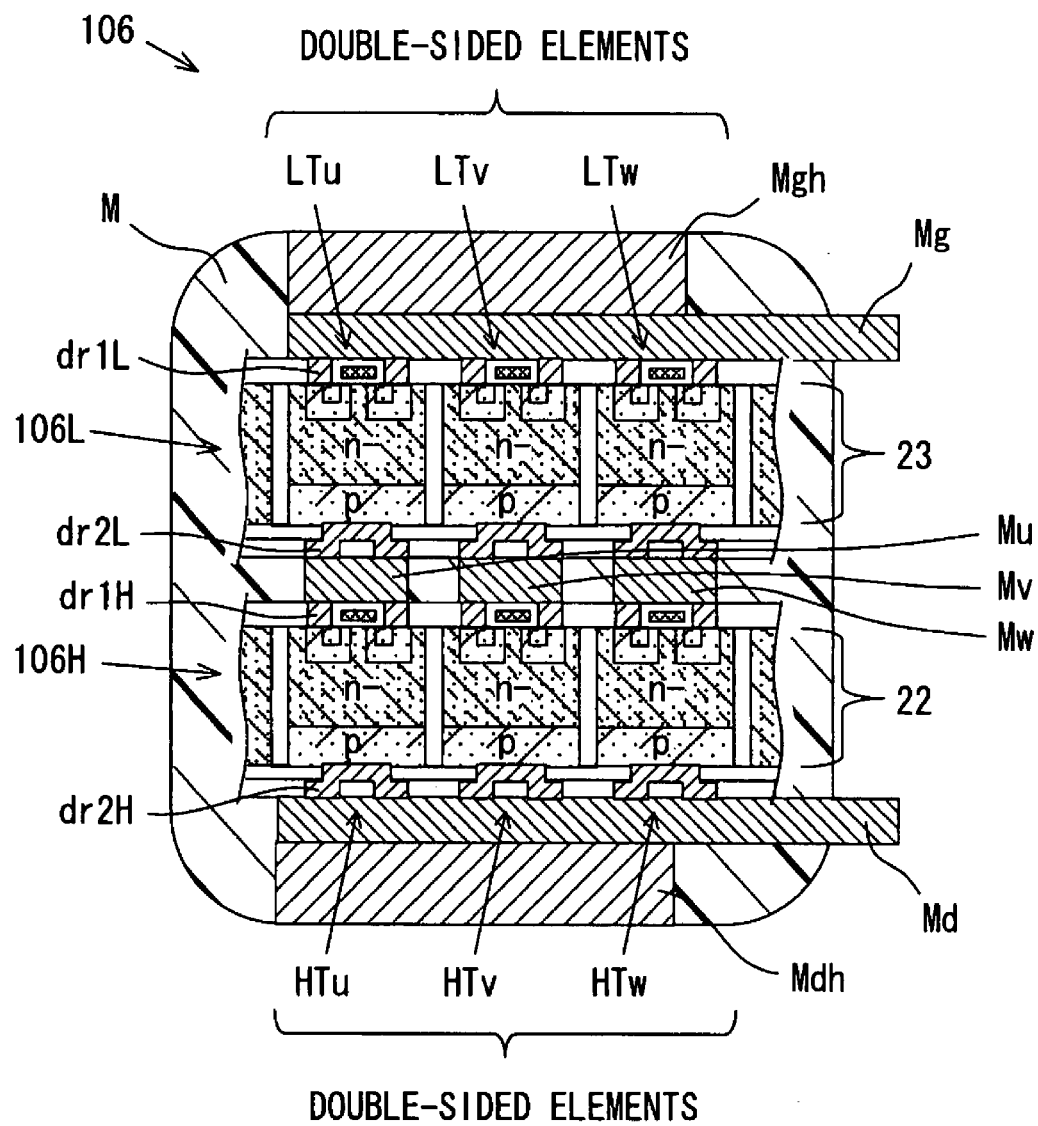
FIG. 14 shows an illustration of a cross section of a semiconductor device having the inverter power module.

FIG. 14 shows an example of a semiconductor device having a power module (IPM) of the three-phase circuit inverter of FIG. 12. That is, the illustration in FIG. 14 shows a cross section of the semiconductor device 106. In addition, in the semiconductor device 106 of FIG. 14, like parts have like numbers as the semiconductor device 100 of FIG. 1.

The semiconductor device 106 of FIG. 14 consists of two semiconductor devices 106H, 106L, and the device 106 is molded by resin M. In the semiconductor device 106H, the three high voltage side transistors HTu, HTv, HTw are formed as the double sided electrode element of the semiconductor substrate 22. In the semiconductor device 106L, the three low voltage side transistors LTu, LTv, LTw are formed as the double sided electrode element on semiconductor substrate 23. A source electrode dr1H of each of the power transistors HTu, HTv, HTw in the semiconductor device 106H, and a drain electrode dr2L of each of the power transistors LTu, LTv, LTw in the semiconductor device 106L respectively has a direct connection to the leads Mu, Mv, Mw for taking out each of the three phases u, v, w of the three-phase alternate current. A drain electrode dr2H of each of the power transistors HTu, HTv, HTw of the semiconductor device 106H is commonly connected to a lead Md or a heatsink Mdh. A source electrode dr1L of each of the power transistor LTu, LTv, LTw of the semiconductor device 106L is commonly connected to a lead Mg and a heatsink Mgh. In this manner, in each of the semiconductor devices 106H, 106L, the electrode dr1H, dr2H, dr1L, or dr2L respectively has direct connections to leads Mu, Mv, Mw, Mg as well as connections to the heatsink Mdh, Mgh. Therefore, the semiconductor device 106 shown in FIG. 12 can be used as a power module (IPM) of the three-phase circuit inverter having the high heat dissipation characteristics with low loss.

As shown by the semiconductor device 106 in FIG. 12, the double sided electrode elements in the semiconductor devices 100-106 and 110-115 has a pair of power supply electrodes being distributed on both sides of the semiconductor substrate, thereby making the semiconductor devices to have the high heat dissipation characteristics by low loss when those electrodes are directly connected to lead frames and heat sinks. As a result, the semiconductor device can preferably be used as high tolerance and large current semiconductor device for use in a vehicle.

An described above, the manufacturing method of the semiconductor device of the present invention is method for forming the semiconductor device having plural active or passive elements on one semiconductor substrate, thereby enabling the semiconductor device with the double sided electrode elements to have insulation separation and integration as well as enabling manufacturing in a cost effective manner.

What is claimed is:

1. A semiconductor device with plural active elements and plural passive elements formed on a semiconductor substrate, the semiconductor device comprising:
   plural field areas on the semiconductor substrate; and
   an insulation separation trench that surrounds the plural field areas, wherein
   the insulation separation trench penetrates the semiconductor substrate thereby dividing the semiconductor substrate into the plural field areas,
   each of the plural field areas includes one of an active element from among the plural active elements and a passive element from among the plural passive elements, and
   at least two elements among the plural active elements and the plural passive elements have a pair of power electrodes for power supply disposed in a dispersed manner respectively on both sides of the semiconductor substrate, each of the at least two elements being a double sided electrode element.

2. The semiconductor device of claim 1, wherein
   a half-bridge circuit is formed in the semiconductor device,
   the semiconductor device has a vertical transistor element composed of one of two vertical MOS transistor elements and two IGBT elements of a same structure as double sided electrode elements,
   the half-bridge circuit is formed by two vertical transistor elements connected in series with another double sided electrode element interposed therebetween, and
   the half-bridge circuit outputs its output from a connection point of two vertical transistor elements.

3. The semiconductor device of claim 2, wherein
   the semiconductor device has a power module of a three-phase inverter formed therein,
   the semiconductor device has three sets of the half-bridge circuit, and
   each phase output of the three-phase inverter is taken out from the connection point of the two vertical transistor elements connected in series in each of the three sets of the half-bridge circuit.

4. The semiconductor device of claim 3, wherein
   the semiconductor device has a H bridge circuit formed therein,
   the semiconductor device has two sets of the half-bridge circuit, and
   an output of the H bridge circuit is taken out from each of the connection points of the two vertical transistor elements connected in series in each of the two sets of the half-bridge circuit.

5. The semiconductor device of claim 1, wherein
   two semiconductor devices are paired to form a half-bridge circuit,
   each of the two semiconductor devices includes, as a double sided electrode element, a vertical transistor element of a same structure made of one of a vertical MOS transistor element and an IGBT element,
   the two semiconductor devices are layered with one lead interposed therebetween,
   the vertical transistor element in each of the two semiconductor devices is connected with each other in series through the one lead, and
   the half-bridge circuit outputs an output of the half-bridge circuit from the one lead.

6. The semiconductor device of claim 5, wherein
   the two semiconductor devices are paired to form the power module of the three-phase inverter,
   each of the semiconductor device includes the three vertical transistor elements as the double sided electrode element,
   the two semiconductor devices are used to form three sets of the half-bridge circuit, and
   each of the three leads outputs each phase output of the three-phase inverter.

7. The semiconductor device of claim 5, wherein
   two semiconductor devices are paired to form the half-bridge circuit,
   each of the two semiconductor devices includes, as a double sided electrode element, the two vertical transistor elements,
   the two semiconductor devices are used to form two sets of the half-bridge circuit, and
   the H bridge circuit outputs an output of the H bridge circuit from the two leads.

8. The semiconductor device of claim 2, wherein
   a diode element made of another double sided electrode element is connected in parallel with the vertical transistor element.

9. The semiconductor device of claim 1, wherein
   the double sided electrode element is used as a power element for power supply,
   at least one element among the plural active elements and the plural passive elements in the semiconductor device has, as a single sided electrode element, a pair of power electrode for power supply on a surface of only one side of the semiconductor substrate, and
   the single sided electrode element is used to control the double sided electrode element.

10. The semiconductor device of claim 1, wherein
    the pair of electrodes of each double sided electrode element are respectively wired for connection on both sides of the semiconductor substrate.

11. The semiconductor device of claim 1, wherein
    one electrode of at least one double sided electrode element is connected by a wire disposed on a circuit substrate.

12. The semiconductor device of claim 1, wherein
    one electrode of the at least one double sided electrode element is connected to a heatsink disposed on a circuit substrate.

13. The semiconductor device of claim 1, wherein
    the semiconductor device is for use on an automotive vehicle.

14. The semiconductor device of claim 1, wherein
    the semiconductor substrate is an epitaxial substrate that has a silicon epitaxial layer formed on a bulk single crystal silicon substrate.

15. The semiconductor device of claim 1, wherein
    the insulation separation trench is one of a trench that has an insulator buried therein, a trench that has a conductor buried therein with a side wall oxide film and a trench that has a hollow formed therein.

16. The semiconductor device of claim 1, wherein
    the semiconductor substrate has one of a different conductor-type impurity diffusion layer and a different density impurity diffusion layer relative to the semiconductor substrate formed on at least one side of the semiconductor substrate.

17. The semiconductor device of claim 16, wherein
the impurity diffusion layer is formed in a portion of the field areas among the plural field areas.

18. A method of manufacturing a semiconductor device with plural active elements and plural passive elements formed on a semiconductor substrate, the semiconductor device comprising:
plural field areas on the semiconductor substrate; and
an insulation separation trench that surrounds the plural field areas, wherein
the insulation separation trench penetrates the semiconductor substrate thereby dividing the semiconductor substrate into the plural field areas,
each of the plural field areas includes one of an active element from among the plural active elements and a passive element from among the plural passive elements, and
at least two elements among the plural active elements and the plural passive elements have a pair of power electrodes for power supply disposed in a dispersed manner respectively on both sides of the semiconductor substrate, each of the at least two elements being a double sided electrode element,
the method of manufacturing the semiconductor device comprising:
preparing an element formation semiconductor substrate having a predetermined thickness;
forming, as a yet-penetrating insulation separation trench formation process, a yet-penetrating insulation separation trench from a first side surface of the element formation semiconductor substrate by a predetermined depth for forming the plural field areas and surrounding each of the plural field areas;
polishing, as a substrate polish process, the element formation substrate from a second side to expose a tip of the yet-penetrating insulation separation trench for forming the element formation substrate as the semiconductor substrate and for forming the yet-penetrating insulation separation trench as the insulation separation trench;
forming, as a first side element formation process, parts of the plural active elements and the plural passive elements, including power electrodes, that are on the first side of the element formation semiconductor substrate; and
forming, as a second side element formation process, parts of the plural active elements and the plural passive elements, including power electrodes, that are on the second side of the semiconductor substrate after the polishing the element formation substrate.

19. The method of manufacturing a semiconductor device of claim 18,
wherein the first side element formation process is performed between the yet-penetrating insulation separation trench formation process and the substrate polish process.

20. The method of manufacturing a semiconductor device of claim 18,
wherein the element formation semiconductor substrate is an epitaxial substrate that has a silicon epitaxial layer formed on a bulk single crystal silicon substrate, and
a first side surface of the element formation semiconductor substrate is the silicon epitaxial layer.

21. The method of manufacturing a semiconductor device of claim 18,
wherein the yet-penetrating insulation separation trench is one of a trench that has an insulator buried therein, a trench that has a conductor buried therein with a side wall oxide film and a trench that has a hollow formed therein.

22. The method of manufacturing a semiconductor device of claim 18,
wherein the semiconductor substrate has at least one of a different conductor-type impurity diffusion layer and a different density impurity diffusion layer relative to the semiconductor substrate formed on at least one side of the semiconductor substrate, and
an ion injection process is performed for forming the at least one of a different conductor-type impurity diffusion layer and a different density impurity diffusion layer after the substrate polish process.

23. The method of manufacturing a semiconductor device of claim 22,
wherein the at least one of a different conductor-type impurity diffusion layer and a different density impurity diffusion layer is formed in at least one field area among the plural field areas.

24. A semiconductor device with plural active elements and plural passive elements formed on a semiconductor substrate, the semiconductor device comprising:
plural field areas on the semiconductor substrate; and
an insulation separation trench that surrounds the plural field areas, wherein
the insulation separation trench penetrates the semiconductor substrate for dividing the semiconductor substrate into the plural field areas,
each of the plural field areas includes one of an active element from among the plural active elements and a passive element from among the plural passive elements, and
at least two elements among the plural active elements and the plural passive elements have a pair of power electrodes for power supply disposed on both sides of the semiconductor substrate,
a half-bridge circuit is formed in the semiconductor device,
the semiconductor device has a vertical transistor element composed of one of two vertical MOS transistor elements and two IGBT elements of a same structure as double sided electrode elements,
the half-bridge circuit is formed by two vertical transistor elements connected in series with another double sided electrode element interposed therebetween, and
the half-bridge circuit outputs its output from a connection point of two vertical transistor elements.

25. The semiconductor device of claim 24, wherein
the semiconductor device has a power module of a three-phase inverter formed therein,
the semiconductor device has three sets of the half-bridge circuit, and
each phase output of the three-phase inverter is taken out from the connection point of the two vertical transistor elements connected in series in each of the three sets of the half-bridge circuit.

26. The semiconductor device of claim 25, wherein
the semiconductor device has a H bridge circuit formed therein,
the semiconductor device has two sets of the half-bridge circuit, and
an output of the H bridge circuit is taken out from each of the connection points of the two vertical transistor elements connected in series in each of the two sets of the half-bridge circuit.

27. A semiconductor device with plural active elements and plural passive elements formed on a semiconductor substrate, the semiconductor device comprising:
- plural field areas on the semiconductor substrate; and
- an insulation separation trench that surrounds the plural field areas, wherein
- the insulation separation trench penetrates the semiconductor substrate for dividing the semiconductor substrate into the plural field areas,
- each of the plural field areas includes one of an active element from among the plural active elements and a passive element from among the plural passive elements, and
- at least two elements among the plural active elements and the plural passive elements have a pair of power electrodes for power supply disposed on both sides of the semiconductor substrate,
- two semiconductor devices are paired to form a half-bridge circuit,
- each of the two semiconductor devices includes, as a double sided electrode element, a vertical transistor element of a same structure made of one of a vertical MOS transistor element and an IGBT element,
- the two semiconductor devices are layered with one lead interposed therebetween,
- the vertical transistor element in each of the two semiconductor devices is connected with each other in series through the one lead, and
- the half-bridge circuit outputs an output of the half-bridge circuit from the one lead.

28. The semiconductor device of claim 27, wherein
- the two semiconductor devices are paired to form the power module of the three-phase inverter,
- each of the semiconductor device includes the three vertical transistor elements as the double sided electrode element,
- the two semiconductor devices are used to form three sets of the half-bridge circuit, and
- each of the three leads outputs each phase output of the three-phase inverter.

29. The semiconductor device of claim 27, wherein
- two semiconductor devices are paired to form the half-bridge circuit,
- each of the two semiconductor devices includes, as a double sided electrode element, the two vertical transistor elements,
- the two semiconductor devices are used to form two sets of the half-bridge circuit, and
- the H bridge circuit outputs an output of the H bridge circuit from the two leads.

30. The semiconductor device of claim 24, wherein
- a diode element made of another double sided electrode element is connected in parallel with the vertical transistor element.

* * * * *